US010418507B2

United States Patent
Ohno et al.

(10) Patent No.: US 10,418,507 B2
(45) Date of Patent: Sep. 17, 2019

(54) OPTO-REFLECTOR

(71) Applicant: NEW JAPAN RADIO CO., LTD., Chuo-ku, Tokyo (JP)

(72) Inventors: Fumiaki Ohno, Fujimino (JP); Seiji Koike, Fujimino (JP)

(73) Assignee: NEW JAPAN RADIO CO., LTD., Tokyo (JP)

( * ) Notice: Subject to any disclaimer, the term of this patent is extended or adjusted under 35 U.S.C. 154(b) by 0 days.

(21) Appl. No.: 16/060,006

(22) PCT Filed: Dec. 8, 2015

(86) PCT No.: PCT/JP2015/084436
§ 371 (c)(1),
(2) Date: Jun. 6, 2018

(87) PCT Pub. No.: WO2017/098584
PCT Pub. Date: Jun. 15, 2017

(65) Prior Publication Data
US 2018/0366607 A1 Dec. 20, 2018

(51) Int. Cl.
*H01L 27/14* (2006.01)
*H01L 31/173* (2006.01)
(Continued)

(52) U.S. Cl.
CPC .......... *H01L 31/173* (2013.01); *G01S 7/4813* (2013.01); *G01S 7/4814* (2013.01);
(Continued)

(58) Field of Classification Search
None
See application file for complete search history.

(56) References Cited

U.S. PATENT DOCUMENTS 4,040,078 A * 8/1977 Eckton, Jr. ............ H01L 31/173
250/551
5,731,582 A 3/1998 West
(Continued)

FOREIGN PATENT DOCUMENTS

JP H04-032547 3/1992
JP H05-037110 A 2/1993
(Continued)

OTHER PUBLICATIONS

International Search Report and Written Opinion for related International Application No. PCT/JP2015/084436, dated Jan. 26, 2016; 8 pages; English translation of ISR provided.

*Primary Examiner* — Ali Naraghi
(74) *Attorney, Agent, or Firm* — Procopio, Cory, Hargreaves & Savitch LLP

(57) ABSTRACT

To achieve an opto-reflector in which a distance to a detection target is shortened to be able to detect the position of the closer detection target, and thereby contributing to the reduction of the arrangement space. The opto-reflector (10) includes a plate-shaped substrate (11); a light emitting element (13) and a light receiving element (14) mounted on the substrate (11); light transmitting resin layer (12) which seals the light emitting element (13) and the light receiving element (14); and a light shielding portion (21) provided between the light emitting element (13) and the light receiving element (14). The light shielding portion (21) is formed at a height such that a part of light beam can be directly transferred between the light emitting element (13) and the light receiving element (14) via the light transmitting resin layer (12).

5 Claims, 10 Drawing Sheets

(51) Int. Cl.
    *G01S 7/481* (2006.01)
    *H01L 23/00* (2006.01)
    *H01L 25/16* (2006.01)
    *G01S 17/46* (2006.01)
    *H01L 23/552* (2006.01)
    *H01L 33/48* (2010.01)
    *H01L 33/54* (2010.01)

(52) U.S. Cl.
    CPC ............ *G01S 7/4816* (2013.01); *G01S 17/46* (2013.01); *H01L 23/552* (2013.01); *H01L 24/42* (2013.01); *H01L 25/167* (2013.01); *H01L 24/32* (2013.01); *H01L 24/48* (2013.01); *H01L 24/73* (2013.01); *H01L 33/486* (2013.01); *H01L 33/54* (2013.01); *H01L 2224/32225* (2013.01); *H01L 2224/48091* (2013.01); *H01L 2224/48227* (2013.01); *H01L 2224/48465* (2013.01); *H01L 2224/73265* (2013.01); *H01L 2924/00014* (2013.01); *H01L 2924/12041* (2013.01); *H01L 2924/12043* (2013.01); *H01L 2924/15153* (2013.01)

(56) References Cited

U.S. PATENT DOCUMENTS 8,716,722 B2 * 5/2014 Peng .................. H01L 23/31
                                                    257/82
9,600,123 B2 * 3/2017 Shimizu ............ H01L 31/02327

FOREIGN PATENT DOCUMENTS

| JP | H05-152603 A | 6/1993 |
|----|--------------|--------|
| JP | H08-023121 A | 1/1996 |
| JP | H11-354832 A | 12/1999 |
| JP | 2007-013050 A | 1/2007 |
| JP | 2013-187357 A | 9/2013 |

* cited by examiner (A)

(B)

(A)

(B)

(A)

(B)

(A)

(B)

OPTO-REFLECTOR

CROSS-REFERENCE TO RELATED APPLICATIONS

This application is a U.S. National Stage entry of PCT Application No: PCT/JP2015/084436 filed on Dec. 8, 2015, the contents of which are incorporated herein by reference.

TECHNICAL FIELD

The present invention relates to an opto-reflector which has a light emitting element and a light receiving element, and detects a position or the like of an object by detecting reflected light.

BACKGROUND ART

As an example of the opto-reflector in the related art, a configuration example of a surface mount type opto-reflector having a light emitting element and a light receiving element mounted on a substrate is illustrated. FIGS. 8(A) and 8(B) are views illustrating a configuration example of an opto-reflector in the related art, wherein FIG. 8(A) is a plan view seen from the top of the element and FIG. 8(B) is a side sectional view seen from the side.

In the opto-reflector 100 of the related art, a light emitting element 103 and a light receiving element 104 are mounted on a substrate 101, and the light emitting element 103 and the light receiving element 104 are sealed with a light transmitting resin layer 102. Between the light emitting element 103 and the light receiving element 104, a light shielding wall 107 made of a resin having a low beam transmittance is provided in order to reduce noise due to the direct beam being transferred between the elements. As an example of providing a light shielding wall between the light emitting element and the light receiving element, there is a proximity sensor disclosed in, for example, Patent Literature 1.

CITATION LIST

Patent Literature

[Patent Literature 1]: JP-A-11-354832

SUMMARY OF THE INVENTION

Technical Problem

Recently, opto-reflectors are mounted on mobile devices such as mobile terminals represented by smartphones, and are now being used for applications such as position detection of autofocus lenses of camera modules. In this type of mobile device, since there is a demand for higher functionality from the market, the placement space for components to be mounted becomes a problem. Increasing the product size for components to be mounted is difficult due to restrictions in design, and downsizing of individual modules or devices is required.

Here, as an application example of the opto-reflector, explanation will be given taking the case of detecting the position of the autofocus lens of the camera module as an example. In order to detect the position of the autofocus lens that is displaced in the camera module, it is necessary to provide a reflective object interlocking with the movement of the lens in the direction of the optical axis, dispose the opto-reflector to face the reflective object, and detect the reflected light from the reflective object by the opto-reflector. At this time, the position of the autofocus lens is detected by detecting the distance to the reflective object, by utilizing the characteristic that the change of the output signal of the light receiving element of the opto-reflector correlates with the distance to the reflective object.

In order to improve the function and miniaturization of the camera module, when trying to reduce the displacement space of the opto-reflector, techniques such as thinning the opto-reflector itself and shortening the distance to the detection target are considered. In the configuration of the related art, if the optical reflector is simply made thin, there are problems in which rigidity of the substrate is insufficient, positional precision in mounting is not sufficiently obtained, the arrangement interval between the light emitting element and the light receiving element needs to be large, and a mounting area of the package of the opto-reflector increases. In the above-described example of the related art, noise due to direct beam is reduced by the light shielding wall, but it is necessary to secure a certain distance to the detection target, and the distance to the detection target capable of detecting the position is long. Thus, it was difficult to further shorten the detectable distance and to reduce the arrangement space.

An object of the present invention is to achieve an opto-reflector capable of shortening a distance to a detection target, enabling position detection of a closer detection target object, and contributing to a reduction in arrangement space.

Solution to Problem

The present invention provides an opto-reflector which includes a plate-shaped substrate; a light emitting element and a light receiving element mounted on the substrate; a light transmitting resin layer sealing the light emitting element and the light receiving element; and a light shielding portion located between the light emitting element and the light receiving element. The light shielding portion is formed at a height such that a part of light beam can be directly transferred between the light emitting element and the light receiving element via the light transmitting resin layer.

Further, in the above opto-reflector, an air layer may be located between the light transmitting resin layer to seal the light emitting element and the light transmitting resin layer to seal the light receiving element, and a part of the light beam can be directly transferred between the light emitting element and the light receiving element via the light transmitting resin layer and the air layer.

Further, in the above opto-reflector, the substrate may include a plurality of recessed portions, the light emitting element and the light receiving element are disposed so as to be accommodated in one of the plurality of recessed portions, respectively, and the light shielding portion may be formed by a side wall portion of the recessed portion between the light emitting element and the light receiving element.

Further, in the above opto-reflector, a reflective film may be provided on at least a side wall portion of the recessed portion in which the light emitting element or the light receiving element is disposed.

Further, in the above opto-reflector, a part of an upper end of the light emitting element and a part of the upper end of the light receiving element may be positioned above an upper end of the light shielding portion.

Advantageous Effects of the Invention

According to the present invention, it is possible to achieve an opto-reflector capable of shortening the distance to the detection target, enabling position detection of a closer detection target object, and contributing to the reduction of the arrangement space.

BRIEF DESCRIPTION OF THE DRAWINGS

FIGS. 1(A) and 1(B) are views illustrating a configuration of an opto-reflector according to a first embodiment of the present invention, wherein FIG. 1(A) is a plan view as seen from above the element and FIG. 1(B) is a side cross-sectional vise as seen from the side.

FIG. 2(A) illustrates a configuration of this embodiment and FIG. 2(B) illustrates a configuration of an example in the related art.

FIG. 3(A) is a plan view as seen from the top of the element and FIG. 3(B) is a side cross-sectional view seen from the side.

FIG. 6(A) is a plan view viewed from the top of the element. FIG. 6(B) is a side sectional view as seen from the side.

FIG. 8(A) is a plan view as seen from above the element. FIG. 8(B) is a side cross-sectional view seen from the side.

DESCRIPTION OF EMBODIMENTS

Hereinafter, an embodiment (hereinafter referred to as "the present embodiment") which specifically discloses an opto-reflector according to the present invention will be described in detail with reference to the drawings.

In this embodiment, for example, a configuration example of the opto-reflector used for detecting the position of an autofocus lens of a camera module mounted on a mobile device is illustrated.

(Background to the Contents of each Embodiment of the Present Invention)

To describe the configuration of the present embodiment, the problems in reducing the arrangement space of the opto-reflector will be described in more detail.

Figure 9:
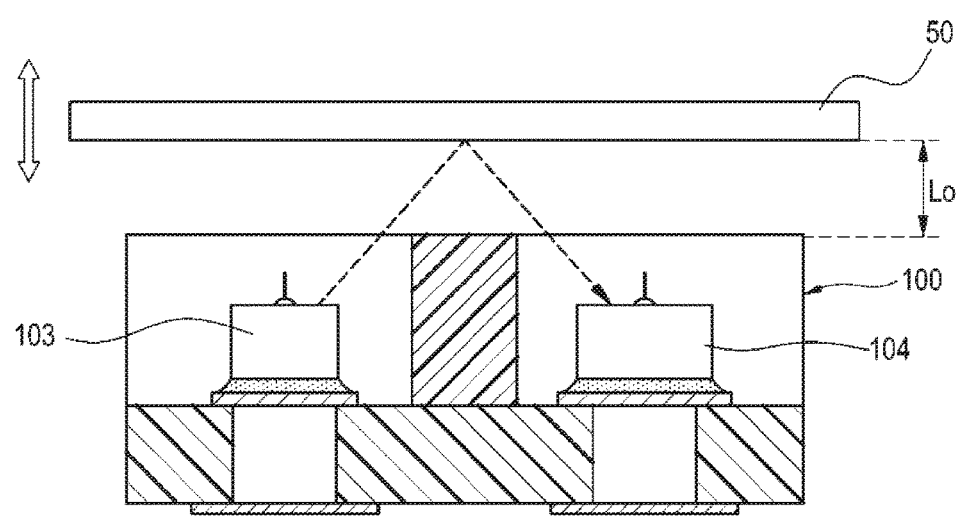
FIG. 9 is an explanatory view illustrating the distance between the opto-reflector and the detection target in the example of the related art.
Figure 10:
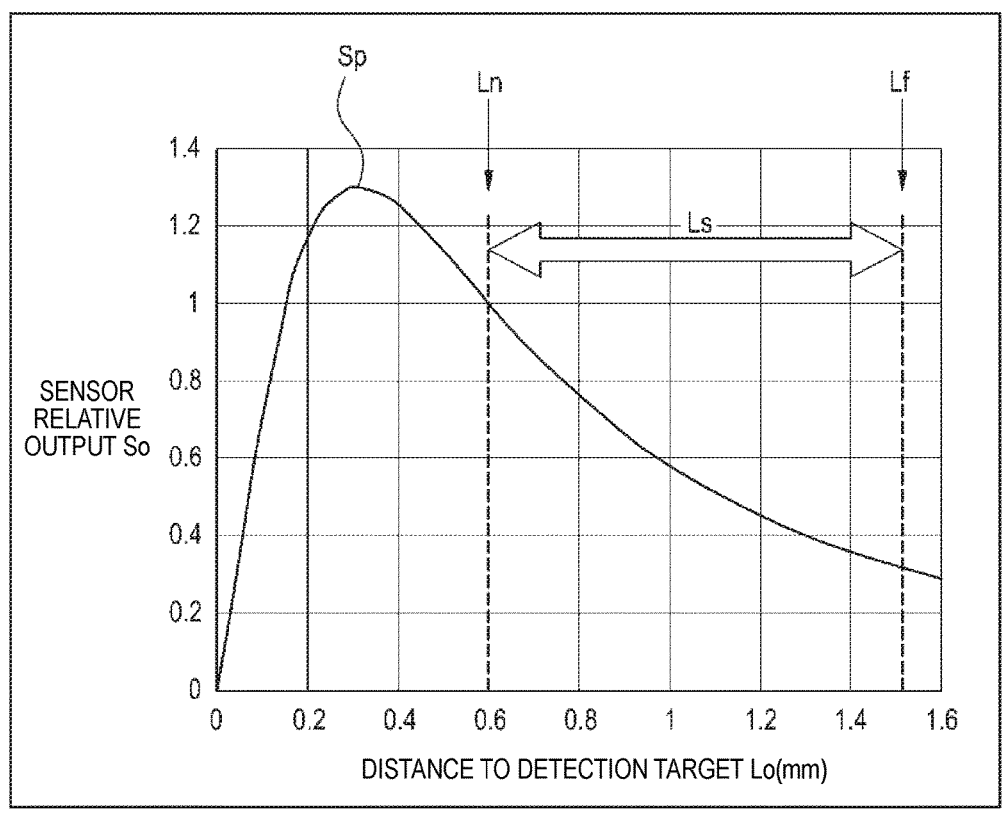
FIG. 10 is a characteristic diagram illustrating a relationship between the output of the opto-reflector of the example in the related art and the distance to the detection target

FIG. 9 is an explanatory diagram illustrating the distance between the opto-reflector and the detection target in the example of the related art, and FIG. 10 is a characteristic diagram illustrating the relationship between the output of the opto-reflector of the example in the related art and the distance to the detection target.

In the following description, an example of a surface mount type opto-reflector that detects the position of the autofocus lens of the camera module will be described. In this case, in the camera module, a reflective object displaced in conjunction with movement of the autofocus lens in the direction of the optical axis is provided, and this reflective object is set as the detection target 50, and as illustrated in FIG. 9, the opto-reflector 100 is disposed to face the detection target 50. The opto-reflector 100 radiates detection beam from the light emitting element 103 toward the detection target 50, and receives reflected light reflected from the detection target 50 by the light receiving element 104.

The output (output current) of the opto-reflector 100 has characteristics as illustrated in FIG. 10 depending on the distance Lo from the upper end surface of the opto-reflector 100 to the detection target 50 (reflector). In FIG. 10, the vertical axis indicates the magnitude of the sensor relative output as the sensor output of the opto-reflector 100 and normalizes the output value at the closest position of the position-detectable detection target 50 as 1. The horizontal axis represents the distance Lo to the detection target 50 (reflective object). The sensor relative output So is represented by a curve approximating a polynomial expression of the output current of the opto-reflector 100. The sensor output of the opto-reflector 100 has a characteristic that the sensor output value correlates with the position of the reflective object within a predetermined range.

In order to detect the distance to the detection target 50 with high accuracy, a region is used which corresponds to a range far from the output peak point Sp of the sensor output and in which the sensor output monotonically decreases with increasing distance. For example, when trying to detect a range of 0.9 mm as the position detection range Ls of the detection target 50, in the example of FIG. 10, the range of the distance Lo to the detection target object 50 capable of detecting the position is 0.6 to 1.5 mm. In this case, the distance of the reflection object at the output peak point Sp of the sensor output is 0.3 mm, the distance Ln to the detection target 50 at the latest position in the position detection range is 0.6 mm, and the distance Lf to the farthest position is 1.5 mm.

Here, for the purpose of downsizing the camera module which is a mounted device, in order to reduce the arrangement space of the opto-reflector, it is considered to reduce the distance to the detection target which can detect the position. In order to shorten the distance to the detection target, it is necessary to bring the position of the output peak point Sp of the sensor output close to zero and move it to the left side in the characteristic diagram of FIG. 10.

Therefore, in view of the above circumstances, in the present embodiment, a configuration example of the opto-reflector in which the output peak point Sp of the sensor output is brought close to zero, the distance to the detection target is shortened, the position of the detection target closer can be detected, and it is possible to contribute to miniaturization will be described below.

(First Embodiment)

Figure 1:
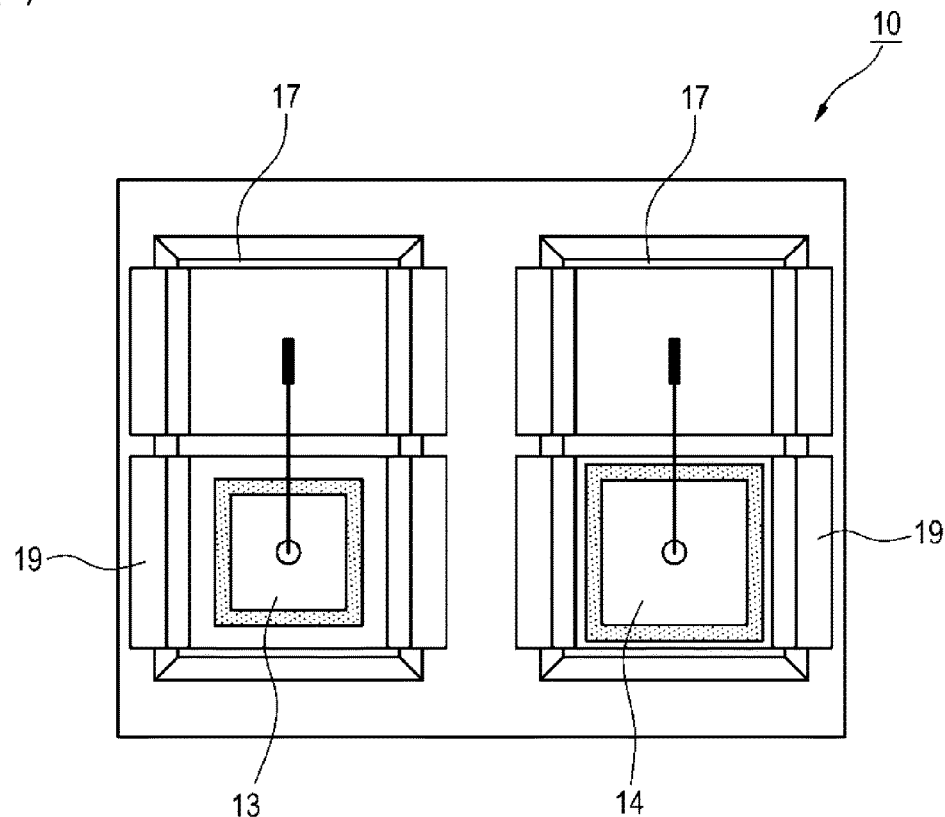
Figure 1:
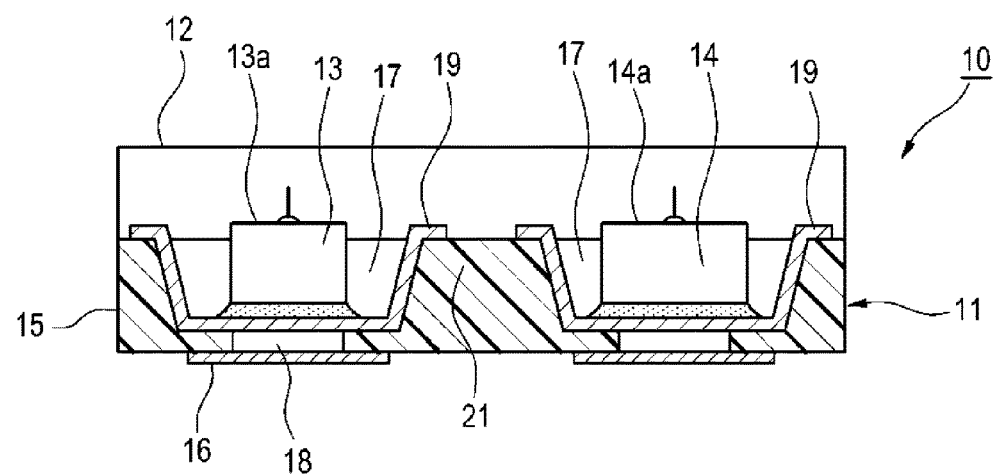

FIG. 1(A) is a plan view as seen from the top of the element, and FIG. 1(B) is a cross-sectional view as seen from the side. The opto-reflector 10 is formed by mounting a light emitting element 13 and a light receiving element 14 on a substrate 11.

The substrate 11 is a printed wiring board formed by a copper-clad laminate in which a copper foil 16 of a conductive material is adhered to a plate-shaped base body 15 made of a hard insulating material such as glass epoxy. A plurality of recessed portions 17 are formed on one surface (upper surface in the drawing) of the substrate 11, through holes are formed through the other surface (bottom surface in the drawing) by laser processing or the like, and the metal of the conductive the material is buried into the through hole to form a via hole 18. A metal pattern 19 constituting the metal film is formed in a range reaching the bottom portion and the side wall portion of the recessed portion 17, and further the top surface portion of the base body 15 so as to close the upper portion of the via hole 18. The copper foil 16 and the metal pattern 19 are patterned into a predetermined shape by etching, serve as connection electrodes for the outside and the inside of the substrate 11, respectively, and are connected to each other via the via hole 18.

The light emitting element 13 is an element such as a light emitting diode (LED), and is mounted so as to emit beam to the detection target. The light receiving element 14 is an element such as an opto transistor and is mounted so as to be able to receive the beam reflected by the detection target. In this case, the necessary connection between the light emitting element 13 and the light receiving element 14 is formed by the die bonding and the wire bonding.

The light transmitting resin layer 12 having a high beam transmittance is provided on the mounting surface (the surface on the upper side in the drawing) of the light emitting element 13 and the light receiving element 14 on the substrate 11, and the light emitting element 13 and the light receiving element 14 are sealed by the light transmitting resin layer 12.

The light emitting element 13 and the light receiving element 14 are disposed to be housed in one of the plurality of recessed portions 17 of the substrate 11. Here, as illustrated in FIG. 1(B), a part of the upper end 13a of the light emitting element 13 or a part of the upper end 14a of the light receiving element 14 protrudes without burying the recessed portion 17 in the light emitting element 13 and the light receiving element 14. The protruding portions transfer direct beam with each other, but most of the beam is transferred through reflection on the detection target. A light shielding portion 21 for shielding a part of beam transmitted and received between the light emitting element 13 and the light receiving element 14 is formed by the side wall portion between the two recessed portions 17 in the substrate 11. Here, a part of the upper end 13a of the light emitting element 13 and a part of the upper end 14a of the light receiving element 14 are exposed above the upper end of the light shielding portion 21.

Figure 2:
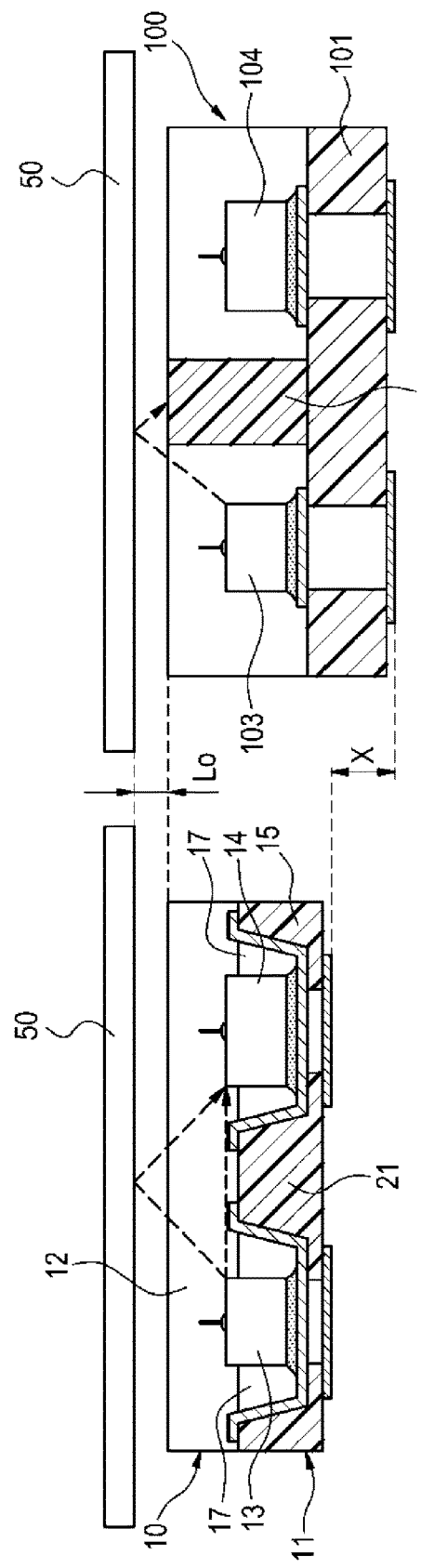
FIGS. 2(A) and 2(B) are explanatory views schematically illustrating a path of beam in the opto-reflector.

FIGS. 2(A) and 2(B) are views schematically illustrating a path of beam in the opto-reflector, wherein FIG. 2(A) is a configuration of this embodiment and FIG. 2(B) is an explanatory diagram illustrating a configuration of an example in the related art. In FIGS. 2(A) and 2(B), the broken line with an arrow schematically illustrates the path of beam for understanding.

As illustrated in FIG. 2(A), in the opto-reflector 10 of the present embodiment, a part of the light emitting element 13 and a part of the light receiving element 14 are exposed from the recessed portion 17 of the substrate 11, little direct light is transferred between the light emitting element 13 and the light receiving element 14, and most of the reflected light reflected from the detection target 50 is transferred. Although not illustrated in the drawing, reflected light reflected from the upper end of the light transmitting resin layer 12 is transferred. As described above, in the present embodiment, a small amount of direct beam is intentionally transferred between the light emitting element 13 and the light receiving element 14. In contrast, in the example in the related art illustrated in FIG. 2(B), a light shielding wall 107 that shields the direct beam between the light emitting element 103 and the light receiving element 104 is included, and in a state in which the detection target 50 is in proximity, beam emitted from the element 103 is blocked by the light shielding wall 107 and does not enter the light receiving element 104.

In the present embodiment, by intentionally transmitting a small amount of direct beam between the light emitting element 13 and the light receiving element 14, even when the distance Lo to the detection target 50 is short, the position detection can be performed even when the emitted beam is received by the light receiving element 14, and in a state in which the detection target object 50 is very close to the opto-reflector 10. That is, the output peak point Sp of the sensor output can be brought close to zero, and it is possible to detect the position of the detection target 50 at a short distance. Since air exists between the light transmitting resin layer 12 and the detection target 50, when the angle exceeds a predetermined critical angle, beam from the light emitting element 13 does not reach the detection target 50 due to total reflection, and one of the beam is reflected directly incident on the light receiving element 14, and another beam is reflected in the beam transmitting resin layer 12 due to total reflection and is incident on the light receiving element 14. However, the incident portion plays a role of increasing the output value of the light receiving element 14.

Further, in the present embodiment, since the recessed portion 17 is formed in the substrate 11 and the light emitting element 13 and the light receiving element 14 are mounted in the recessed portion 17, only by partially reducing the thickness of the substrate 11, the light shielding portion 21 can be formed and the light emitting element 13 and the light receiving element 14 can be disposed. Therefore, in order to reduce the thickness of the opto-reflector, it is possible to maintain a sufficient strength as compared with the case of simply thinning the substrate, prevent the deflection of the substrate 11, and to obtain flatness required for mounting of the light emitting element 13 and the light receiving element 14. Further, in the present embodiment, since the light shielding wall made of resin or the like is not provided, additional steps such as machining for forming the light shielding wall can be reduced.

Therefore, according to the present embodiment, even if the rigidity of the entire substrate 11 is increased and the thickness from the bottom surface of the recessed portion 17 to the back surface of the substrate is made considerably thin, there arises a problem of deflection which is difficult to mount and seal, and it is possible to reduce the height (thickness) of the package of the opto-reflector. In the example illustrated in FIGS. 2(A) and 2(B), compared to the example in the related art of FIG. 2(B), this embodiment of FIG. 2(A) can achieve a reduction in height by the dimension X.

(Second Embodiment)

Figure 3:
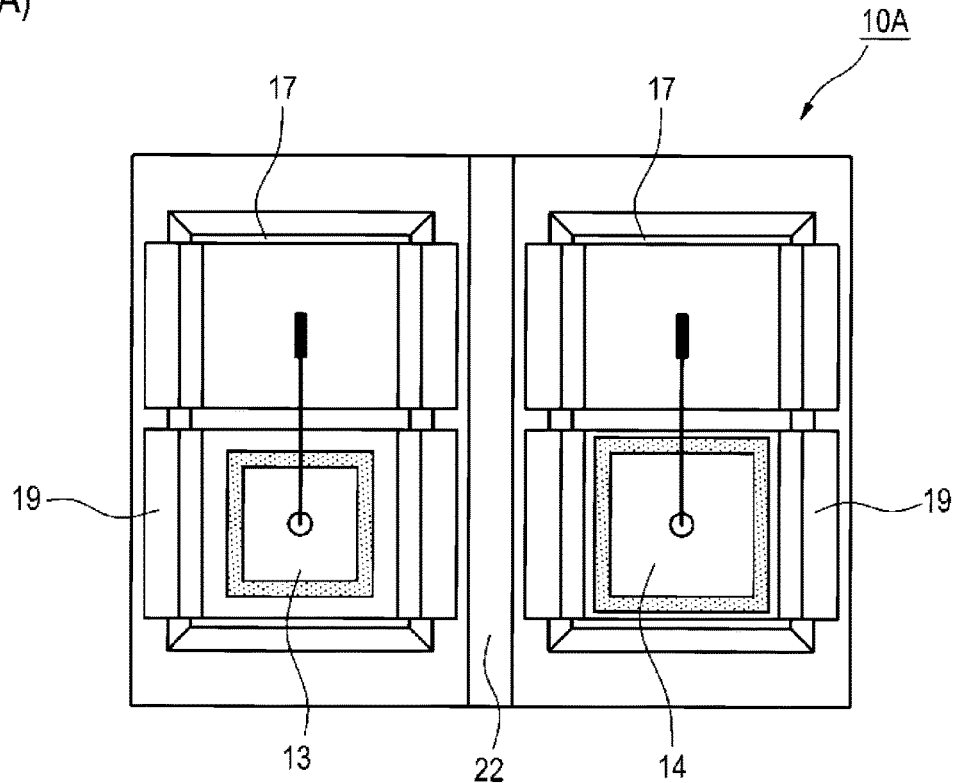
FIGS. 3(A) and 3(B) are views illustrating a configuration of the opto-reflector according to a second embodiment of the present invention.
Figure 3:
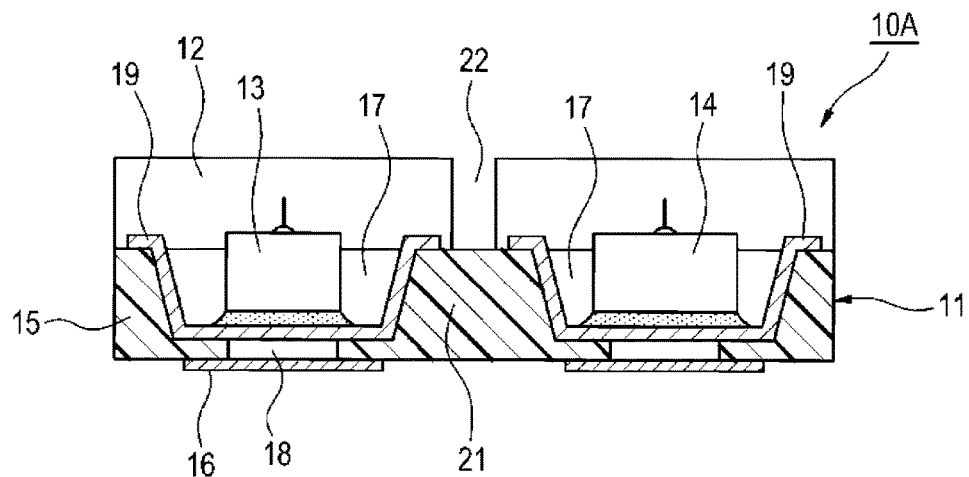

FIGS. 3(A) and 3(B) are views of the opto-reflector according to the second embodiment of the present invention, wherein FIG. 3(A) is a plan view as seen from the top of the element and FIG. 3(B) is a side cross-sectional view as seen from the side. The optical reflector 10 of the second embodiment is a configuration example in which the configuration of the light transmitting resin layer 12 is changed as compared with the first embodiment illustrated in FIGS. 1(A) and 1(B). In the second embodiment, the same reference numerals are given to the same or equivalent constituent elements as those of the first embodiment, and the description thereof is omitted.

In the second embodiment, the light transmitting resin layer 12 to seal the light emitting element 13 and the light receiving element 14 has a slit 22 for dividing the space between the light emitting element 13 and the light receiving element 14, and an air layer is formed between the light receiving element 14 and the light receiving element 14 by the slit 12. The slit 22 can be formed by a cutting process using a blade or the like, and the width of the slit 22 can be set to an appropriate size, for example, by selecting the thickness of the blade. However, when it is unnecessary to set the fine size of the slit 22, the slit 22 can also be provided by a mold at the time of molding the light transmitting resin layer 12. Further, in the example of FIGS. 3(A) and 3(B), the slit 22 is provided over the entire thickness of the light transmitting resin layer 12 and reaches the upper end surface of the substrate 11. However, the slit 22 may be formed in a part of the thickness of the light transmitting resin layer 12. Further, in the light transmitting resin layer 12, an air layer may be formed by a configuration other than a slit such as a recessed portion.

Figure 4:
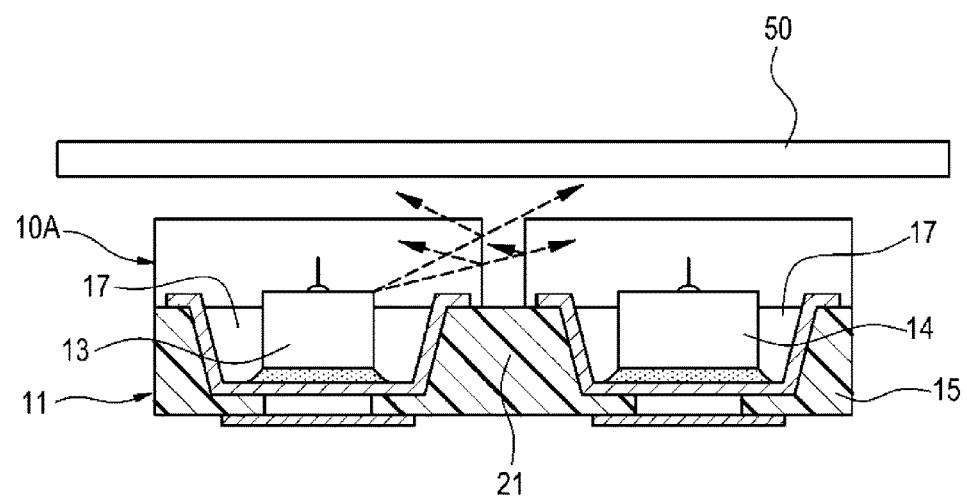
FIG. 4 is an explanatory view schematically illustrating a path of beam in an opto-reflector according to a second embodiment.

FIG. 4 is an explanatory diagram schematically illustrating the path of beam in the opto-reflector of the second embodiment. In FIG. 4, the broken line with an arrow schematically illustrates the path of beam for understanding.

In the second embodiment, by providing the slit 22 between the light emitting element 13 and the light receiving element 14 of the light transmitting resin layer 12, a part of the beam normally incident directly from the light emitting element 13 to the light receiving element 14 can be reflected by the side wall (the interface between the light transmitting resin layer 12 and the air layer) of the slit 22 due to the difference in refractive index between the light transmitting resin layer 12 and the air layer. Thus, the amount of beam received by the light receiving element 14 is reduced. By adjusting the width of the slit 22, the amount of direct beam can be transferred. Therefore, by adjusting the width of the slit 22 according to the application as a sensor and the required resolution, a sufficient magnitude can be ensured for the change in the sensor output with respect to the change in the relative distance between the detection target 50 and the opto-reflector.

Figure 5:
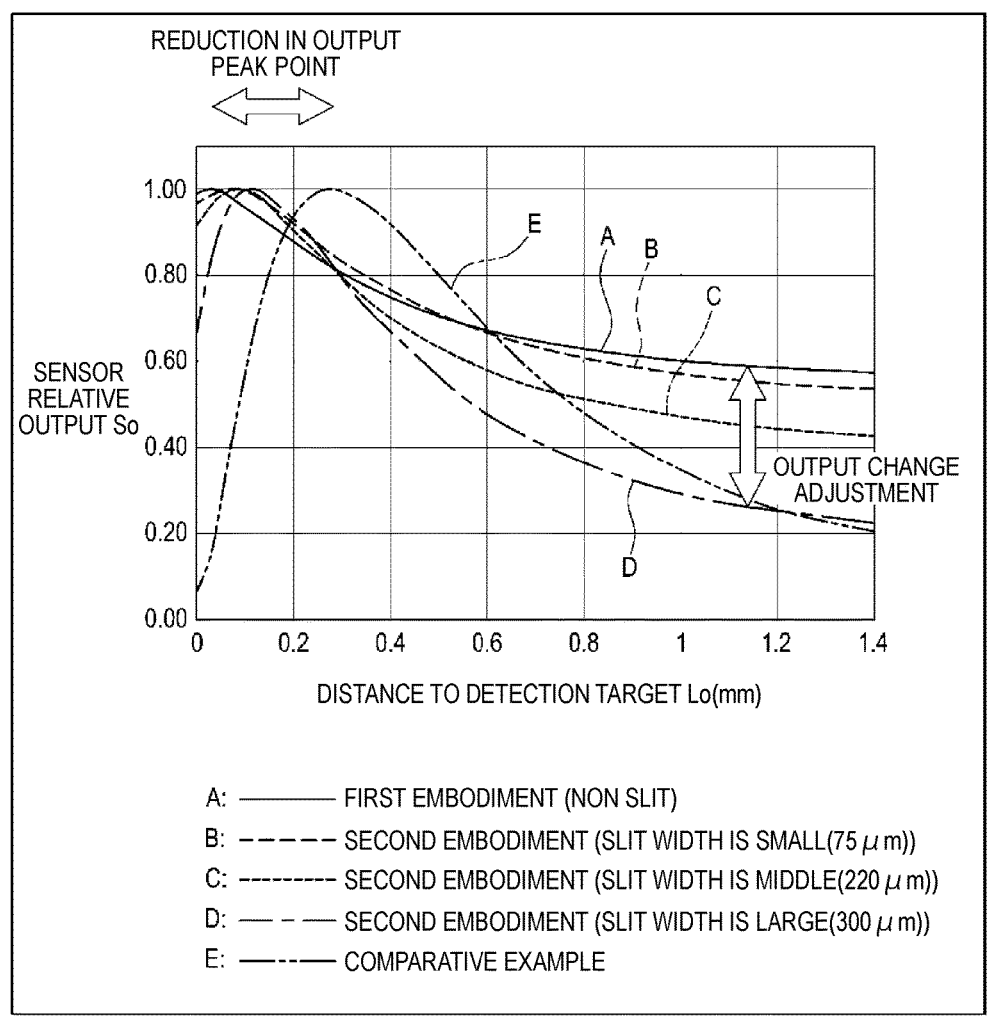
FIG. 5 is a characteristic diagram illustrating a relationship between the output of the opto-reflector and the distance to the detection target of the present embodiment.

FIG. 5 is a characteristic diagram illustrating the relationship between the output of the opto-reflector of this embodiment and the distance to the detection target. In FIG. 5, the vertical axis represents the magnitude of the sensor relative output as the sensor output of the opto-reflector, and normalizes the output value (current value) of the output peak point Sp of the sensor output as 1. The horizontal axis represents the distance Lo to the detection target (reflective object). The sensor relative output So represents the output current of the opto-reflector. The opto-reflector approximates this curve by a polynomial, converts it into straight line, and calculates the distance to the detection target.

The characteristic curves of the respective sensor outputs illustrated in FIG. 5 correspond to the following configuration example.

A: Configuration example of the first embodiment (configuration of FIGS. 1(A), 1(B), and 2(A)) no slit B: Configuration example of the second embodiment (configuration of FIGS. 3(A), 3(B), and 4) slit width is small (75 μm)

C: Configuration example of the second embodiment (configurations of FIGS. 3(A), 3(B), and 4) slit width is middle (220 μm)

D: Configuration example of second embodiment (configuration of FIGS. 3(A), 3(B), and 4) slit width is large (300 μm)

Figure 8:
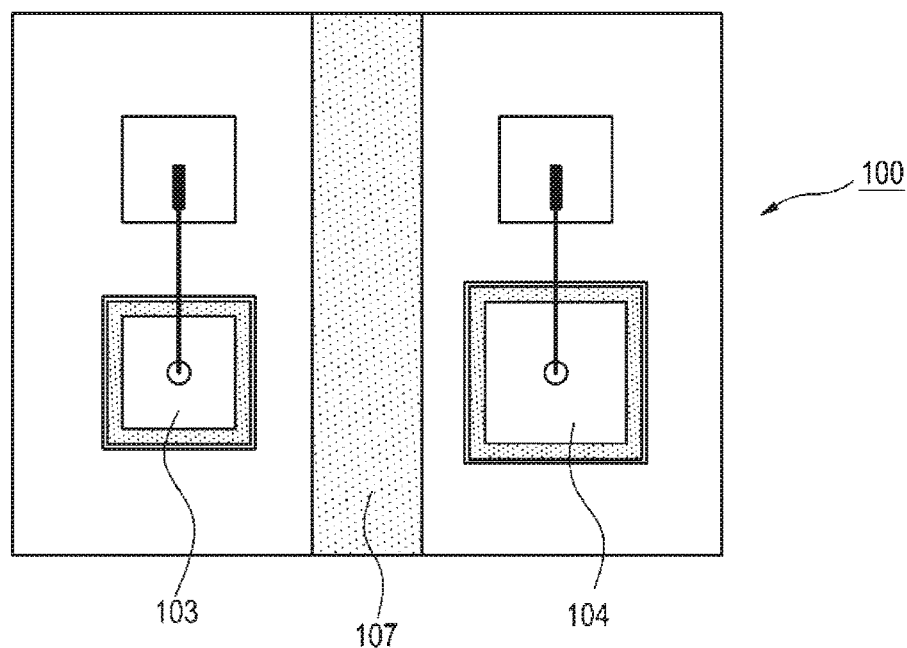
FIGS. 8(A) and 8(B) are views illustrating a configuration example of an opto-reflector in the related art.
Figure 8:
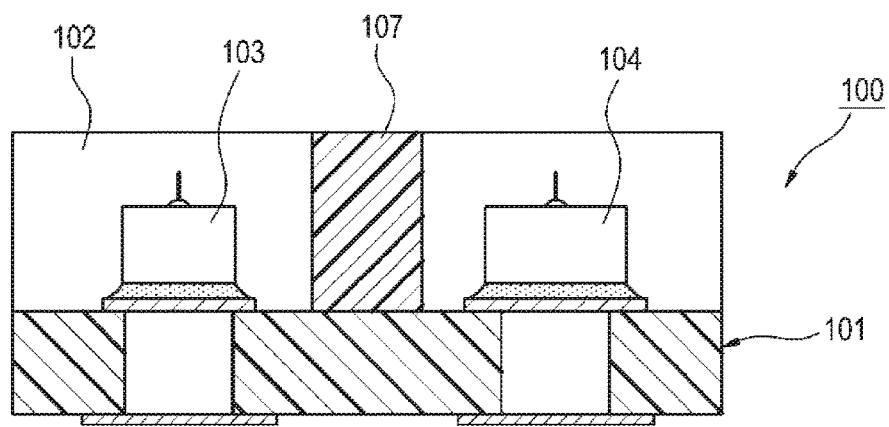

E: Comparative example (example in the related art) (configuration of FIGS. 8(A), 8(B), and 2(B))

As illustrated in the characteristic of FIG. 5, the configuration of the present embodiment makes it possible to bring the output peak point of the sensor output close to zero as compared with the comparative example (example in the related art). As a specific example, the output peak point of the sensor output is 0.15 mm or less, and it is possible to move the position detection range of the detection target to a position close to the detection peak point. In the illustrated example, the output peak point of the sensor output is 0.03 mm for A, 0.07 mm for B, 0.08 mm for C and 0.11 mm for D (0.30 mm for comparative example E).

Further, in the case of the configuration in which the slits are provided as in the second embodiment, it is possible to adjust the slope of the sensor output characteristic, that is, the output change amount with respect to the change in the distance to the detection target, by adjusting the width of the slit. In the illustrated example, the slope of the sensor output characteristic is steeper for D with a larger slit width than for B with a small slit width. As the slit width becomes larger, the absolute value of the output peak point of the sensor output becomes smaller. In this case, by setting the slit width to be large, the output change amount with respect to the position change of the detection target becomes large, and the resolution of the position detection can be made more precise.

(Third Embodiment)

Figure 6:
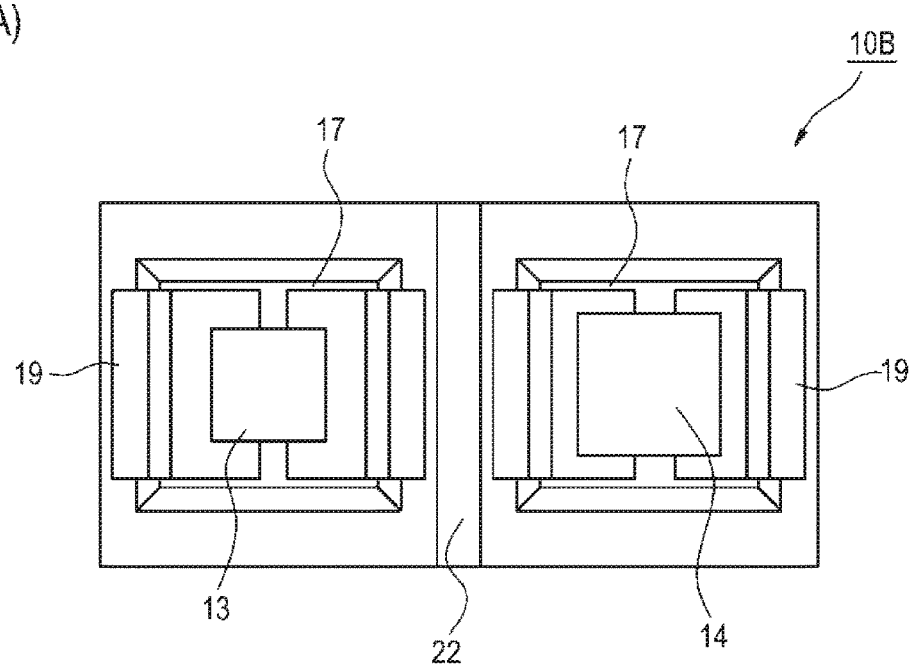
FIGS. 6(A) and 6(B) are views illustrating a configuration of an opto-reflector according to a third embodiment of the present invention.
Figure 6:
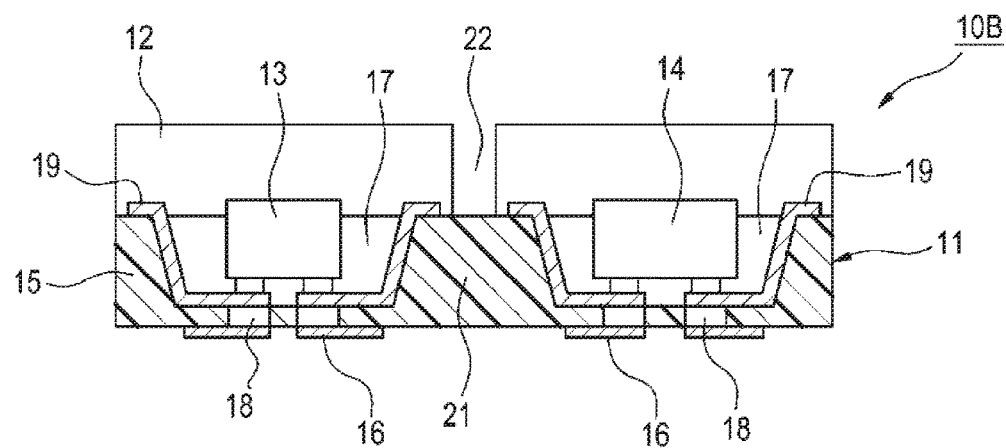

FIGS. 6(A) and 6(B) are views illustrating a configuration of an opt reflector according to a third embodiment of the present invention, wherein FIG. 6(A) is a plan view as seen from above the element and FIG. 6(B) is a plan view seen from the side of the element. Compared to the second embodiment illustrated in FIGS. 3(A) and 3(B), the opto-reflector 10B of the third embodiment is a configuration example in which the mounting configurations of the light emitting element 13 and the light receiving element 14 are changed. In the third embodiment, the same or equivalent constituent elements as those of the first and second embodiments are denoted by the same reference numerals, and description thereof is omitted.

In the third embodiment, the light emitting element 13 and the light receiving element 14 are formed by a surface mount type chip and are mounted on the bottom surface of the recessed portion 17 by wireless bonding. Note that the configuration in which the light emitting element 13 and the light receiving element 14 are provided by the surface mount type chip can be applied to any of the first embodiment in FIGS. 1(A) and 1(B) and the second embodiment in FIGS. 3(A) and 3(B). Also in the configuration of the third embodiment, as in the first and second embodiments, it is possible to further reduce the limit of the detection distance, while reducing the thickness of the opto-reflector.

In the configurations of the first to third embodiments, the material of the metal pattern 19 constituting the metal film deposited on the side wall of the recessed portion 17 of the substrate 11 is made glossy with high beam reflectance, and the recessed portion 17 may have a reflecting film. Therefore, it is possible to make the recessed portion 17 function as a reflecting mirror and increase the amount of beam received by the light receiving element 14.

(Fourth Embodiment)

Figure 7:
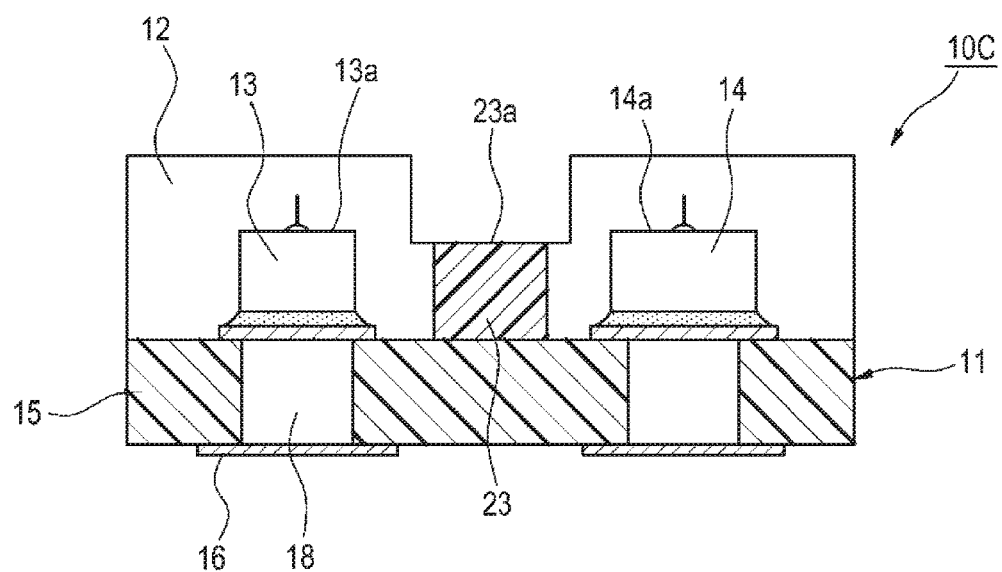
FIG. 7 is a diagram illustrating a configuration of an opto-reflector according to a fourth embodiment of the present invention, and is a side sectional view seen from the side of the element.

FIG. 7 is a diagram illustrating a configuration of an opto-reflector according to a fourth embodiment of the present invention, and is a side sectional view seen from the side of the element. An opto-reflector 10C of the fourth embodiment is a configuration example in which the light shielding wall between the light emitting element 13 and the light receiving element 14 is formed to be low.

In the fourth embodiment, the substrate 11 is a printed wiring board formed by a copper clad laminate in which a copper foil 16 of a conductive material is adhered to a plate-shaped base body 15 made of a hard insulating material, and has no recessed portion. On the substrate 11, the light emitting element 13 and the light receiving element 14 are respectively mounted by face-down bonding, and these light emitting elements 13 and light receiving elements 14 are sealed with the light transmitting resin layer 12.

Between the light emitting element 13 and the light receiving element 14 on the substrate 11, a light shielding wall 23 made of resin with low beam transmittance is provided. A light shielding portion for shielding a part of the direct beam transferred between the elements is formed by the light shielding wall 23. Here, similarly to the first embodiment shown in FIGS. 1(A) and 1(B), the light emitting element 13 and the light receiving element 14 are configured so that a part of the upper end 13a of the light emitting element 13 and a part of the upper end 14a of the light receiving element 14 are disposed in the state of being exposed upward than the upper end 23a of the light shielding wall 23. This structure can be achieved by a configuration in which a part of the light transmitting resin layer 12 and the light shielding wall 23 are notched, and like the slit 22 of the second embodiment, it can be formed by a cutting process using a blade or the like. By adjusting the height of the light shielding wall 23, the amount of direct beam transferred between the elements of the light emitting element 13 and the light receiving element 14 is adjusted, and the output level of the light receiving element of the opto-reflector and the distance of the output peak point of the sensor output and the like can be appropriately set.

As in the fourth embodiment, even in the configuration in which the light shielding portion that shields a part of the direct beam is formed by the light shielding wall 23, as in the first and second embodiments, the limit of the detection distance can be further shortened.

As described above, in the opto-reflectors of the first to third embodiments, the light shielding wall is not provided, and the side wall portion of the recessed portion of the substrate is used as the light shielding portion. Therefore, the rigidity of the substrate can be increased by the thickness of the portion other than the recessed portion, and the size of the opto-reflector can be reduced.

Further, in the opto-reflector of the present embodiment, even when the detection target comes close, the beam of the light emitting element is irradiated on the detection target without being blocked by the light shielding wall, and the beam reflected by the detection target is incident on the light receiving element without being blocked by the light shielding wall. Therefore, the position detectable distance can be significantly shortened as compared with the one in the related art, which can contribute to downsizing and thinning of the application using the opto-reflector.

Further, in the configuration in which the side wall portion of the recessed portion of the substrate functions as a light shielding portion as in the first to third embodiments, it is not necessary to provide a light shielding wall between the light emitting element and the light receiving element. Thus, the formation of the light shielding wall can be reduced, and the size of the opto-reflector can be reduced.

Further, as in the second embodiment, a slit or the like having a predetermined width is provided between the light emitting element and the light receiving element in response to a change in the distance from the detection target according to the application to provide a configuration having the air layer. Thus, the change amount in the sensor output can be adjusted. For example, when it is desired to increase the change amount in the sensor output, by increasing the width of the slit (air layer), the change amount of the sensor output with respect to the distance change can be increased. In this way, depending on the required resolution of the distance detection for each use of the opto-reflector, it can be appropriately adjusted by the width of the air layer provided between the light emitting element and the light receiving element.

As described above, according to the present embodiment, by appropriately selecting the height of the beam shielding portion, the thickness of the light transmitting resin layer, the distance between the light emitting element and the light receiving element, and the width of the air layer provided between the light emitting element and the light receiving element, it is possible to reduce the height while maintaining the rigidity, and it is possible to detect the detection target at a position closer to the position than before. With the configuration of the present embodiment, it is possible to achieve an opto-reflector which can further shorten the limit of the detection distance, and can contribute to reduction of the arrangement space.

Although various embodiments have been described with reference to the drawings, it is needless to say that the present invention is not limited to such examples. It will be apparent to those skilled in the art that various modifications or modifications can be conceived within the scope of the claims, and it is understood that those belonging to the technical scope of the present invention. Further, within the scope not deviating from the gist of the present invention, the respective constituent elements in the above embodiment may be arbitrarily combined.

INDUSTRIAL APPLICABILITY

The present invention has an effect of making it possible to further shorten the limit of the detection distance and contributing to the reduction of the arrangement space, and is useful for, for example, an opto-reflector or the like mounted in an electronic device such as a mobile device.

REFERENCE SIGNS LIST 10, 10A, 10B, 10C: Opto-reflector
11: Substrate
12: Light transmitting resin layer
13: Light emitting element
13a: Upper end
14: light receiving element
14a: Upper end
15: Substrate
16: Copper foil
17: Recessed portion
18: Via hole 19: Metal pattern
21: Light shielding portion
22: Slit
23: Light shielding wall
23a: Upper end
50: Detection target

The invention claimed is:

1. An opto-reflector comprising:
   a plate-shaped substrate;
   a light emitting element and a light receiving element mounted on the substrate;
   a light transmitting resin layer sealing the light emitting element and the light receiving element; and
   a light shielding portion located between the light emitting element and the light receiving element,
   wherein the light shielding portion is formed at a height such that a part of light beam can be directly transferred between the light emitting element and the light receiving element via the light transmitting resin layer, and
   wherein when an incident angle exceeds a predetermined critical angle, a first part of the light is directly incident on the light receiving element, and a second part of the light is reflected in the beam transmitting resin layer due to total reflection and incident on the light receiving element.

2. The opto-reflector according to claim 1,
   wherein an air layer is located between the light transmitting resin layer to seal the light emitting element and the light transmitting resin layer to seal the light receiving element, and a part of the light beam can be directly transferred between the light emitting element and the light receiving element via the light transmitting resin layer and the air layer.

3. The opto-reflector according to claim 1,
   wherein the substrate includes a plurality of recessed portions, each of the light emitting element and the light receiving element is disposed so as to be accommodated in one of the plurality of recessed portions, and the light shielding portion is formed by a side wall portion of the recessed portion between the light emitting element and the light receiving element.

4. The opto-reflector according to claim 3,
   wherein a reflective film is provided on at least the side wall portion of the recessed portion in which the light emitting element or the light receiving element is disposed.

5. The opto-reflector according to claim 1,
   wherein a part of an upper end of the light emitting element and a part of an upper end of the light receiving element are positioned above an upper end of the light shielding portion.

* * * * *